(12) United States Patent
Tsutsui

(10) Patent No.: US 8,088,677 B2
(45) Date of Patent: Jan. 3, 2012

(54) METHOD OF MANUFACTURING SEMICONDUCTOR DEVICE, AND SEMICONDUCTOR DEVICE

(75) Inventor: Gen Tsutsui, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/458,337

(22) Filed: Jul. 8, 2009

(65) Prior Publication Data

US 2010/0013017 A1 Jan. 21, 2010

(30) Foreign Application Priority Data

Jul. 18, 2008 (JP) .................................. 2008-186755

(51) Int. Cl.
*H01L 21/00* (2006.01)
(52) U.S. Cl. ........ 438/505; 438/517; 438/770; 257/392; 257/E27.06; 257/E21.616; 257/E21.639
(58) Field of Classification Search .................. 438/769, 438/770, 766, 505, 508, 517; 257/E21.246, 257/E21.247, E21.248, E21.282, E21.283, 257/E21.284, E21.285, E21.625, E21.639, 257/392, E27.06, E21.616
See application file for complete search history.

(56) References Cited

U.S. PATENT DOCUMENTS

| | | | | |
|---|---|---|---|---|
| 5,576,226 A * | 11/1996 | Hwang | ......................... | 438/275 |
| 6,541,395 B1 * | 4/2003 | Trivedi et al. | ................. | 438/775 |
| 6,602,751 B2 * | 8/2003 | Oohashi | ........................ | 438/275 |
| 2001/0016388 A1 * | 8/2001 | Koyama et al. | .............. | 438/275 |
| 2001/0018274 A1 * | 8/2001 | Sugizaki et al. | .............. | 438/773 |
| 2001/0026983 A1 * | 10/2001 | Fujita | ............................ | 438/306 |
| 2001/0039093 A1 * | 11/2001 | Oohashi | ........................ | 438/275 |
| 2002/0013067 A1 * | 1/2002 | Taniguchi et al. | ............ | 438/787 |
| 2007/0063273 A1 * | 3/2007 | Yoneda | ......................... | 257/333 |

FOREIGN PATENT DOCUMENTS

| | | |
|---|---|---|
| JP | 2006-93670 | 4/2006 |
| JP | 2006-344634 | 12/2006 |
| JP | 2007-19191 | 1/2007 |
| JP | 2007-165627 | 6/2007 |

OTHER PUBLICATIONS

P. Chowdhury, et al "Improvement of ultrathin gate oxide and oxynitride integrity using fluorine implantation technique" Applied Physics Letters, vol. 70, No. 1 (Jan. 1997) pp. 37-39.*
X.-W. Wang, et al "Pre-oxidation fluorine implantation into Si, process-related MOS characteristics" Journal of the Electrochemical Society vol. 139, No. 1 (Jan. 1992) pp. 238-241.*
M. Inoue, "Flourine Incorporation into HfSiON Dielectric for Vth Control and Its Impact on Reliability for Poly-Si Gate pFET", IEDM Technical Digest, Oct. 2005, p. 413.
A. Tsujikawa et al., A Simple Approach to Optimizing Ultra-thin SiON Gate Dielectrics Independently for n- and p-MOSFETs, IEDM Technical Digest, Oct. 2005.

* cited by examiner

*Primary Examiner* — Caridad Everhart
(74) *Attorney, Agent, or Firm* — McGinn IP Law Group, PLLC

(57) ABSTRACT

A method of manufacturing a semiconductor device including implanting an element selected from fluorine and nitrogen, over the entire region of a semiconductor substrate; oxidizing the semiconductor substrate to thereby form a first oxide film over the surface of the semiconductor substrate; selectively removing the first oxide film in a partial region; oxidizing the semiconductor substrate in the partial region to thereby form a second oxide film thinner than the first oxide film in the partial region; and forming gates to thereby form transistors.

16 Claims, 13 Drawing Sheets

METHOD OF MANUFACTURING SEMICONDUCTOR DEVICE, AND SEMICONDUCTOR DEVICE

This application is based on Japanese patent application No. 2008-186755 the content of which is incorporated hereinto by reference.

BACKGROUND

1. Technical Field

The present invention relates to a method of manufacturing a semiconductor device, and thus-manufactured semiconductor device.

2. Related Art

Recent VLSI is configured to contain several types of transistors differing in the thickness of gate insulating film. In general, a thin gate insulating film is adopted to the transistors composing a logic section, and a thick gate insulating film is adopted to the transistors composing a peripheral circuit. Characteristics of the individual transistors, such as the individual threshold voltages, are generally adjusted by introducing different doses of an impurity into the channels of the individual transistors. Introduction of an impurity into the channels generally follows the procedures below. All portions, but excluding the transistor aimed at implantation, are covered with a resist, an impurity is implanted, and the resist is then removed. For example, if there are three types of transistors varied in the thickness of gate insulating film in a circuit, the impurity implantation process is repeated three times.

Japanese Laid-Open Patent Publication No. 2006-93670 describes a configuration which is adjustable in the threshold voltage values simply by implanting an impurity into the conventional channel regions, and allows a metal, such as Hf, to reside between the gate insulating film and a Si-containing gate electrode. According to the description, the threshold voltage values of the transistors may be adjustable under a reduced dose of impurity.

Japanese Laid-Open Patent Publication No. 2007-165627 describes a technique of implanting fluorine right under each gate electrode of PMOS, in order to prevent NBTI (Negative Bias Temperature Instability), which is a degradation possibly occurs when each gate of the PMOS transistor is applied with a negative bias. According to the publication, the gate electrodes are formed, and fluorine ion is implanted using the gate electrodes as a mask so as to form a fluorine-implanted layer in a substrate, and the substrate is then annealed to thereby form a fluorine-diffused layer right under the gate electrodes. The publication describes a configuration in which the concentration of the fluorine-implanted layer in peripheral transistors having longer gate length is made higher than concentration of the fluorine-implanted layer in internal transistors having shorter gate length. According to the description, the configuration is contributive to improve NBTI, and is effective for the peripheral circuit where NBTI is more likely to occur.

Japanese Laid-Open Patent Publication No. 2006-344634 describes a technique of implanting fluorine into gate insulating film, for the purpose of suppressing degradation in the NBTI life time. According to the technique, fluorine ion is selectively implanted only into a PMOS transistor-forming region of a semiconductor substrate, and a gate insulating film is formed in each of the PMOS transistor-forming region and an NMOS transistor-forming region by annealing. Accordingly, in the PMOS transistor-forming region, fluorine diffuses from the substrate to the gate insulating film. The publication describes that the fluorine concentration becomes high at the interface between the gate electrode and the gate insulating film.

Japanese Laid-Open Patent Publication No. 2007-19191 describes a technique of forming a capacitor-forming trench in a substrate, an insulating film is formed thereon, and fluorine is then introduced by ion implantation into the substrate while using the insulating film as a through-film. Accordingly, fluorine may be introduced much more in the surficial portion of the substrate and bottom portion of the trench, while suppressing fluorine from being introduced into the side face of the capacitor-forming trench. According to the description, the implantation of fluorine may be contributive to exert an effect of accelerated oxidation on the bottom portion, so that the insulating film may be prevented from being grown unnecessarily thick on the side face, and so that the thickness of the film may be made uniform.

M. Inoue describes, in "Fluorine Incorporation into HfSiON Dielectric for Vth Control and Its Impact on Reliability for Poly-Si Gate PFET", IEDM Technical Digest, October 2005, p. 413, that fluorine implanted before a gate insulating film (HfSiON) is formed finally resides in the gate insulating film.

The present inventor has recognized as follows. Conventional techniques have suffered from a large number of process steps, because different types of transistors needed independent ion implantation processes. Even with the technique described in Japanese Laid-Open Patent Publication No. 2006-93670, implantation of Hf or other metal may shift the threshold voltage of all transistors at a time, making it impossible to independently adjust the threshold voltage of the individual transistors. A plurality of times of fluorine implantation is still necessary even in the techniques described in Japanese Laid-Open Patent Publication Nos. 2007-165627 and 2006-344634.

SUMMARY

According to the present invention, there is provided a method of manufacturing a semiconductor device which includes: implanting an element selected from fluorine and nitrogen, into a first transistor-forming region and a second transistor-forming region contained in a semiconductor substrate; oxidizing the semiconductor substrate to thereby form a first oxide film over the first transistor-forming region and the second transistor-forming region; selectively removing the first oxide film formed over the second transistor-forming region; oxidizing the semiconductor substrate to thereby form a second oxide film thinner than the first oxide film, at least over the second transistor-forming region; and forming a first transistor containing the first oxide film as a gate insulating film in the first transistor-forming region, and forming a second transistor containing the second oxide film as a gate insulating film in the second transistor-forming region.

According to the present invention, there is provided also a semiconductor device which includes: a semiconductor substrate having a first transistor-forming region and a second transistor-forming region respectively containing an element selected from fluorine and nitrogen; a first transistor formed in the first transistor-forming region of the semiconductor substrate, and having a first gate oxide film containing the element; and a second transistor formed in the second transistor-forming region of the semiconductor substrate, and having a second gate oxide film containing the element and thinner than the first gate oxide film, wherein concentration of the element in the first gate oxide film is higher than concentration of the element in the second gate oxide film, and the concentration of the element is uniform in the in-plane direction in each of the first gate oxide film and the second gate oxide film.

If either element selected from fluorine and nitrogen (referred to as threshold value modifier element, hereinafter) is preliminarily implanted into the semiconductor substrate, and when the semiconductor substrate is oxidized thereafter to from an oxide film, a part of the threshold value modifier element migrates into the oxide film. Accordingly, the content of the threshold value modifier element in the second transistor-forming region may be made lower than in the first transistor-forming region, by selectively removing the first oxide film in the second transistor-forming region as described in the above. In other words, the concentration of the element in the oxide film may be varied, even if the threshold value modifier element is implanted commonly into both of the first transistor-forming region and the second transistor-forming region, and thereby the threshold voltage may independently be adjustable.

Note that also any arbitrary combinations of the above-described constituents, and any exchanges of expressions of the present invention among method, device and so forth are valid as embodiments of the present invention.

According to the present invention, the threshold voltage of a plurality of transistors may independently be adjustable, even if the ion implantation therefor is carried out in common.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
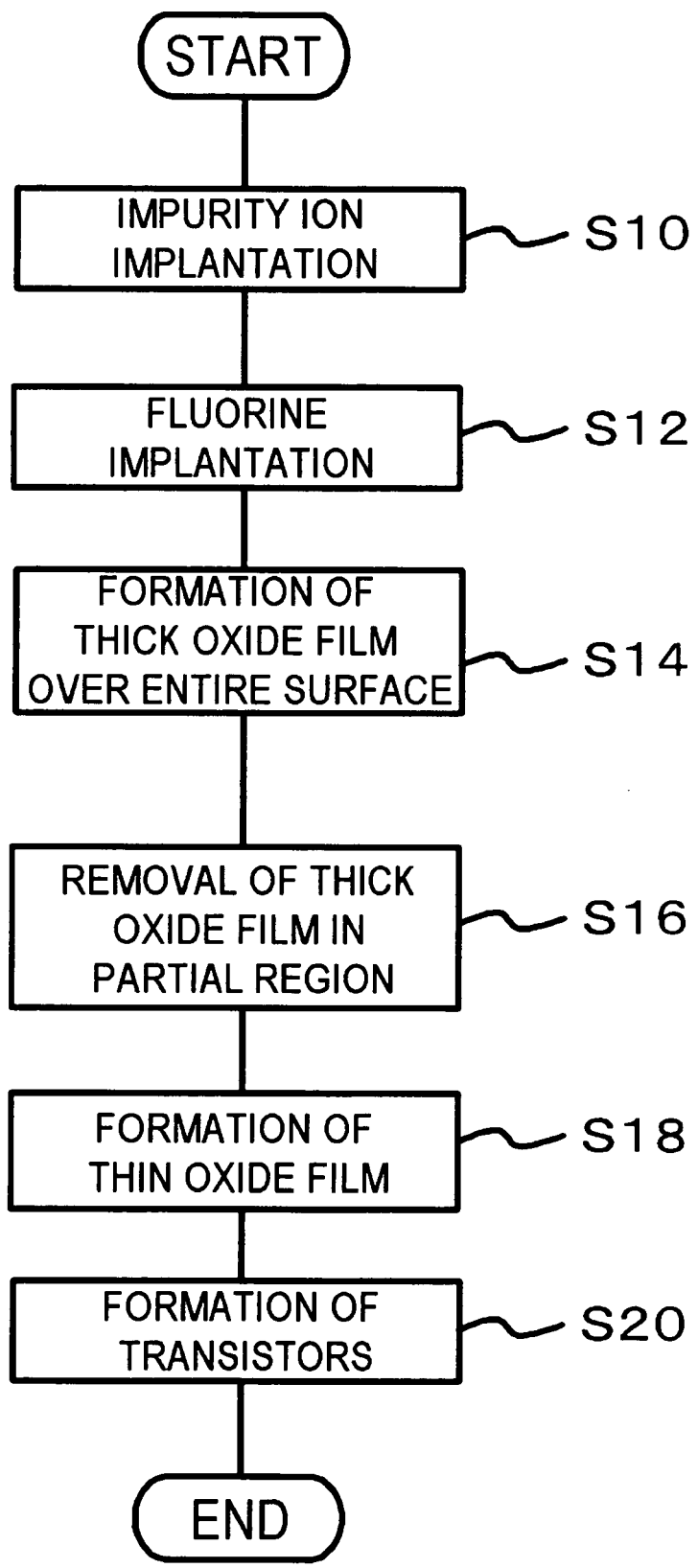
FIG. 1 is a flow chart illustrating procedures of manufacturing a semiconductor device in one embodiment of the present invention.

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Paragraphs below will explain embodiments of the present invention, referring to the attached drawings. Note that, in all drawings, any similar constituents will be given with similar reference numerals or symbols, and explanations therefor will not be repeated.

First, procedures of manufacturing a semiconductor device in one embodiment of the present invention will be briefed. FIG. 1 is a flow chart illustrating procedures of manufacturing a semiconductor device of this embodiment. Paragraphs below will explain procedures of manufacturing two types of transistor, which are a first transistor and a second transistor, having different thickness of gate insulating film. The first transistor and the second transistor may have the same conductivity type.

First, an impurity is introduced by ion implantation commonly into the first transistor-forming region and the second transistor-forming region where the first transistor and the second transistor are respectively formed later therein, to thereby form channels (S10). The impurity adoptable herein may be P (phosphorus), As (arsenic) and so forth for the case of forming n-type channel regions, and may be B (boron), Al (aluminum) and so forth for the case of forming p-type channel regions.

Next, either element selected from fluorine and nitrogen (referred to as threshold value modifier element, hereinafter) is implanted into the first transistor-forming region and the second transistor-forming region (S12). Next, the semiconductor substrate is oxidized, to thereby form a thick oxide film over the entire surface thereof (S14). In this process, a part of the threshold value modifier element preliminarily implanted into the semiconductor substrate migrates into the oxide film. Thereafter, the thick oxide film is removed in a partial region (S16). Here, the partial region may be the second transistor-forming region, for example. Accordingly, the partial region is lowered in the content of threshold value modifier element than in the other region. A thin oxide film is then formed over the entire surface of the semiconductor substrate (S18). Also a part of the threshold value modifier element preliminarily implanted into the semiconductor substrate migrates into the thin oxide film, but only to attain a concentration of the threshold value modifier element lower than that in the thick oxide film. The first transistor and the second transistor are then formed respectively in the first transistor-forming region and the second transistor-forming region (S20). In this way, the concentration of the threshold value modifier element in the individual transistors may be varied, even if the ion implantation is carried out commonly for a plurality of transistors, and thereby the threshold voltage may independently be adjustable.

Figure 2:
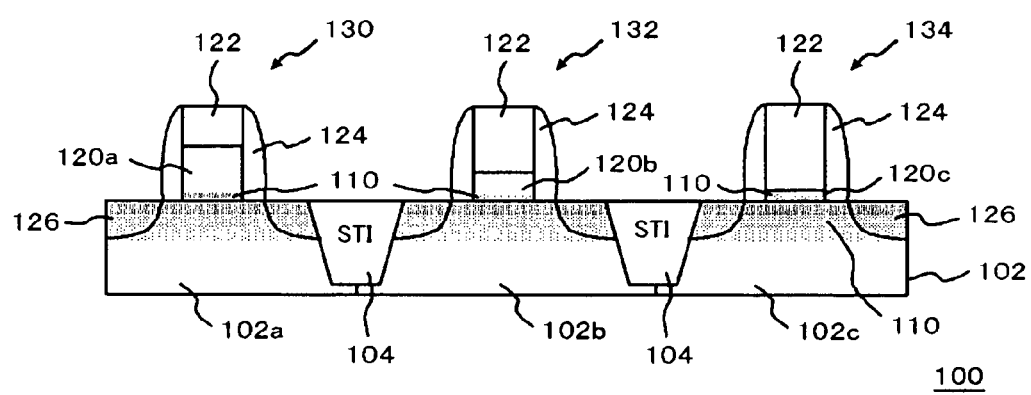
FIG. 2 is a sectional view illustrating a configuration of a semiconductor device of one embodiment of the present invention.

FIG. 2 is a sectional view illustrating a configuration of the semiconductor device of this embodiment.

The semiconductor substrate herein may be a silicon substrate. The threshold value modifier element may be fluorine. The description below will deal with an exemplary case where three types of transistors having different thickness of gate insulating film are formed.

A semiconductor device 100 includes a silicon substrate 102. The semiconductor device 100 includes a first transistor-forming region 102*a*, a second transistor-forming region 102*b*, a third transistor-forming region 102*c*, and device isolation regions (STI: shallow trench isolation) 104 electrically isolating these regions. The semiconductor device 100 further includes a first transistor 130, a second transistor 132, and a third transistor 134 respectively formed in the first transistor-forming region 102*a*, the second transistor-forming region 102*b*, and the third transistor-forming region 102*c*. Each transistor includes a gate which is composed of a gate oxide film formed over the silicon substrate 102, a gate electrode 122 formed thereon, and sidewalls 124 formed on the side faces of the gate oxide film and the gate electrode 122; and source/drain regions 126 formed in the silicon substrate 102 on both sides of the gate.

In this embodiment, the first transistor 130, the second transistor 132, and the third transistor 134 respectively contain a first gate oxide film 120a, a second gate oxide film 120b, and a third gate oxide film 120c. The first gate oxide film 120a, the second gate oxide film 120b, and the third gate oxide film 120c have the thickness different from each other. In the illustrated example, the first gate oxide film 120a, the second gate oxide film 120b, and the third gate oxide film 120c have the thickness in decreasing order, where the first gate oxide film 120a is the thickest.

The first gate oxide film 120a, the second gate oxide film 120b, and the third gate oxide film 120c contain fluorine 110. In the illustrated example, the concentration of fluorine contained in the first gate oxide film 120a (average concentration in the film) is larger than that in the second gate oxide film 120b and in the third gate oxide film 120c. In addition, in the first transistor-forming region 102a, the second transistor-forming region 102b, and the third transistor-forming region 102c, the silicon substrate 102 contains fluorine 110. The concentration of fluorine contained in the silicon substrate 102 in the first transistor-forming region 102a may be made higher than that in the second transistor-forming region 102b and in the third transistor-forming region 102c.

In this embodiment, fluorine is incorporated into the first gate oxide film 120a, the second gate oxide film 120b, and the third gate oxide film 120c in the process of thermal oxidation of the silicon substrate 102, wherein the fluorine concentration in each of the first gate oxide film 120a, the second gate oxide film 120b, and the third gate oxide film 120c is uniform in the in-plane direction. Accordingly, the threshold value of the transistors may be controlled in a desirable manner.

Since the ion implantation into the silicon substrate 102 in this embodiment is carried out once, so that the difference in the fluorine concentration in the first transistor-forming region 102a and in the second transistor-forming region 102b or the third transistor-forming region 102c becomes small. In other words, difference between the fluorine concentration in the first gate oxide film 120a and the fluorine concentrations in the second gate oxide film 120b and the third gate oxide film 120c, as viewed at the same level of height, is made larger than difference between the fluorine concentration in the first transistor-forming region 102a and the fluorine concentrations in the second transistor-forming region 102b and the third transistor-forming region 102c, as viewed at the same level of depth.

The first transistor 130, the second transistor 132, and the third transistor 134 may be configured as transistors of the same conductivity type. For example, the first transistor 130 may be configured as that composing a peripheral circuit, and the second transistor 132 and the third transistor 134 may be configured as those composing a logic section.

Next, exemplary procedures of manufacturing the semiconductor device 100 will be detailed, referring to FIGS. 3A to 8B.

Figure 3A:
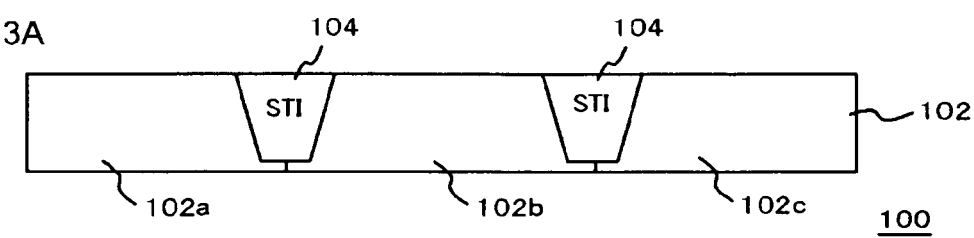
FIGS. 3A to 8B are sectional views illustrating exemplary procedures of manufacturing a semiconductor device in one embodiment of the present invention.
Figure 3B:
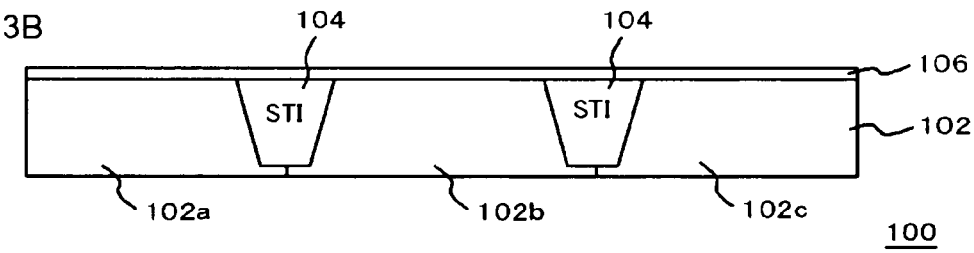
Figure 4A:
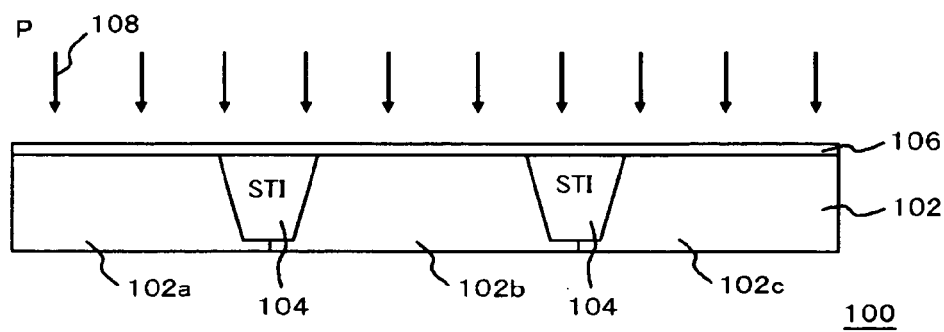

First, device isolation regions 104 are formed in the silicon substrate 102, to thereby electrically isolate the first transistor-forming region 102a, the second transistor-forming region 102b, and the third transistor-forming region 102c (FIG. 3A). Next, a thin oxide film 106 is formed over the entire surface of the silicon substrate 102 (FIG. 3B). Next, using the oxide film 106 as a sacrificial film, phosphorus 108 is implanted over the entire surface of the first transistor-forming region 102a, the second transistor-forming region 102b, and the third transistor-forming region 102c (FIG. 4A). By this process, n-type channels are formed in the first transistor-forming region 102a, the second transistor-forming region 102b, and the third transistor-forming region 102c.

Figure 4B:
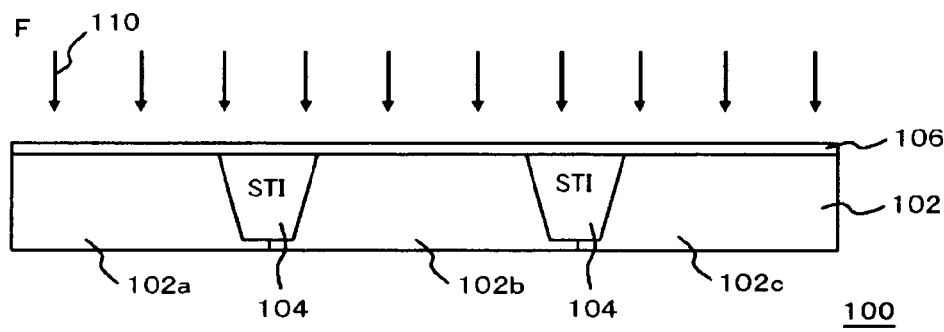

Thereafter, using the oxide film 106 as a sacrificial film, fluorine 110 is implanted over the entire surface of the silicon substrate 102 (FIG. 4B).

Figure 5A:
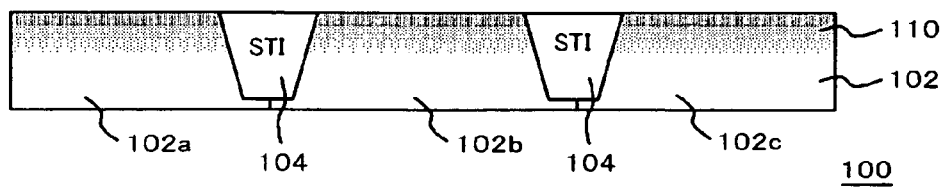
Figure 5B:
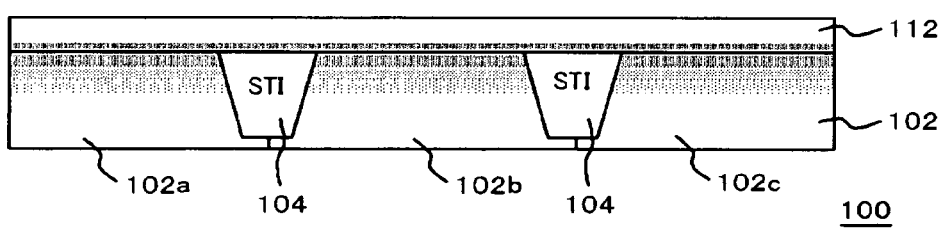

Thereafter, the oxide film 106 is removed typically by etching (FIG. 5A). Next, a first thermal oxide film 112 is formed over the entire surface of the silicon substrate 102 by thermal oxidation (FIG. 5B). In this process, fluorine 110 contained in the silicon substrate 102 is incorporated into the first thermal oxide film 112. In the first thermal oxide film 112, the concentration of fluorine 110 becomes high at the interface with the silicon substrate 102.

Figure 6A:
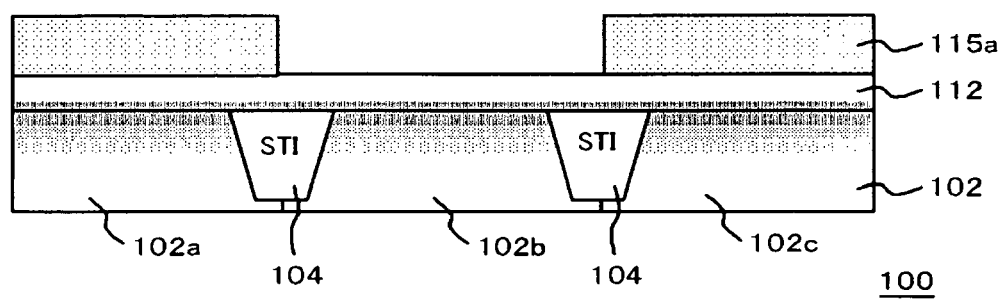
Figure 6B:
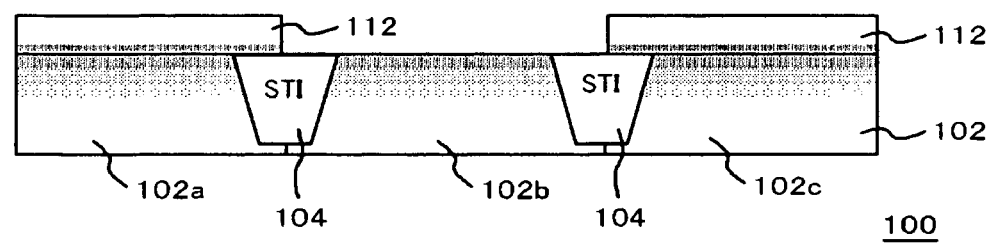

Next, a resist film 115a protecting the region other than the second transistor-forming region 102b is formed over the first thermal oxide film 112 (FIG. 6A). Next, using the resist film 115a as a mask, the first thermal oxide film 112 formed in the second transistor-forming region 102b is selectively removed (FIG. 6B). By the process, the first thermal oxide film 112 having a high concentration of fluorine 110 is removed from the second transistor-forming region 102b.

Figure 7A:
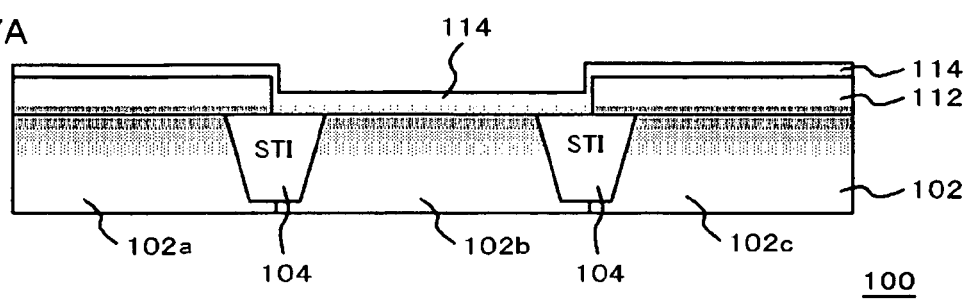

Thereafter, a second thermal oxide film 114 is formed over the entire surface of the silicon substrate 102 by thermal oxidation (FIG. 7A). In this process, fluorine 110 contained in the silicon substrate 102 is incorporated into the second thermal oxide film 114, but only to achieve therein a concentration of fluorine 110 lower than the concentration of fluorine 110 in the first thermal oxide film 112. The thickness of the second thermal oxide film 114 may be smaller than that of the first thermal oxide film 112. By virtue of this configuration, the concentration of fluorine 110 in the second thermal oxide film 114 having a smaller thickness may be made lower than that in the first thermal oxide film 112 having a larger thickness.

Figure 7B:
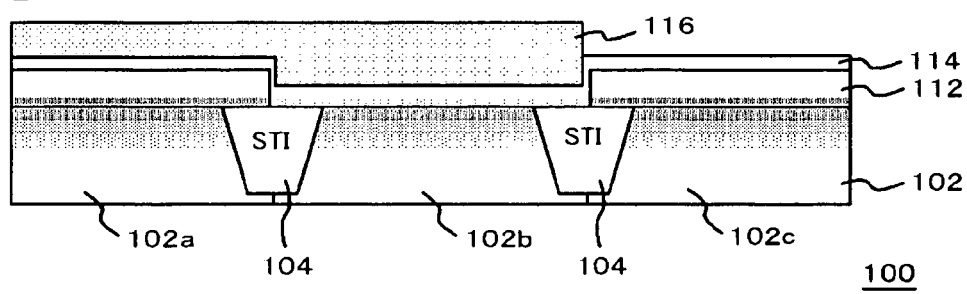
Figure 8A:
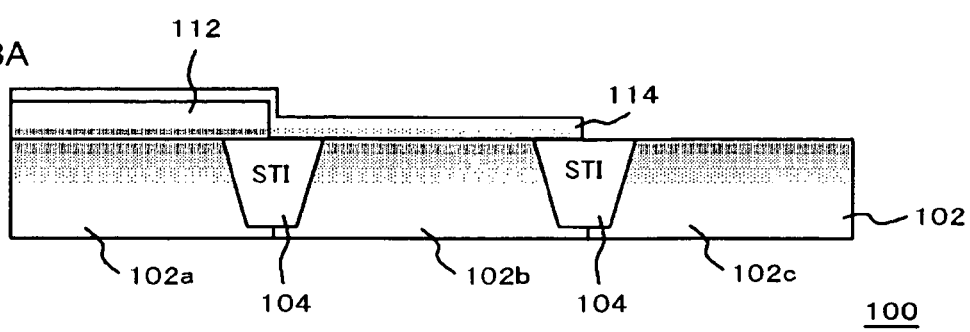
Figure 8B:
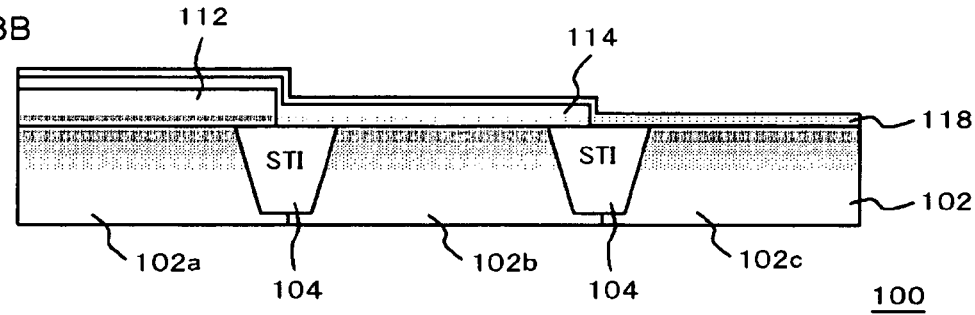

Next, a resist film 116 protecting the region other than the third transistor-forming region 102c is formed over the second thermal oxide film 114 (FIG. 7B). Next, using the resist film 116 as a mask, the second thermal oxide film 114 and the first thermal oxide film 112 formed over the third transistor-forming region 102c is selectively removed (FIG. 8A). Thereafter, a third thermal oxide film 118 is formed over the entire surface of the silicon substrate 102 (FIG. 8B). In this process, fluorine 110 contained in the silicon substrate 102 is incorporated into the third thermal oxide film 118, but only to achieve therein a concentration of fluorine 110 lower than the concentration of fluorine 110 in the first thermal oxide film 112. By virtue of this configuration, the concentration of fluorine 110 in the third thermal oxide film 118 having a smaller thickness may be made lower than that in the first thermal oxide film 112 having a larger thickness. The thickness of the third thermal oxide film 118 herein may be made smaller than that of the first thermal oxide film 112 and the second thermal oxide film 114.

By these processes, the first gate oxide film 120a, the second gate oxide film 120b and the third gate oxide film 120c are formed respectively in the first transistor-forming region 102a, the second transistor-forming region 102b, and the third transistor-forming region 102c. In the illustrated example, the first gate oxide film 120a, the second gate oxide film 120b, and the third gate oxide film 120c have the thickness in decreasing order, where the first gate oxide film 120a is the thickest. The first gate oxide film 120a is composed of the first thermal oxide film 112, the second thermal oxide film 114, and the third thermal oxide film 118 formed in the first transistor-forming region 102a. The second gate oxide film 120b is composed of the second thermal oxide film 114, and the third thermal oxide film 118 formed in the second transistor-forming region 102b. The third gate oxide film 120c is composed of the third thermal oxide film 118 formed in the third transistor-forming region 102c.

The thickness of the first gate oxide film 120a equals to the total thickness of the first thermal oxide film 112, the second thermal oxide film 114, and the third thermal oxide film 118 formed in the first transistor-forming region 102a. The thickness of the second gate oxide film 120b equals to the total thickness of the second thermal oxide film 114 and the third thermal oxide film 118 formed in the second transistor-forming region 102b. The thickness of the third gate oxide film 120c nearly equals to the thickness of the third thermal oxide film 118 formed in the third transistor-forming region 102c.

Note that the thermal oxide film in the process of formation grows thicker in a portion directly brought into contact with the silicon substrate 102, than in a portion over the preliminarily-formed oxide film. As a consequence, in an exemplary case illustrated in FIG. 7A, the second thermal oxide film 114 is formed so as to have a lager thickness in the second transistor-forming region 102b than in the other regions, rather than formed uniformly over the entire surface of the silicon substrate 102.

In this embodiment, an exemplary configuration may be such that the first gate oxide film 120a is 70 Å thick, the second gate oxide film 120b is 30 Å thick, and the third gate oxide film 120c is 20 Å thick. The first gate oxide film 120a has the concentration of fluorine 110 larger than that in the second gate oxide film 120b and in the third gate oxide film 120c.

Thereafter, an electrode material layer, which is processed to give the gate electrodes later, is formed over the individual gate insulating films, and the electrode material layer and the gate insulating films are patterned to give electrode patterns. Next, the sidewalls 124 are formed on both sides of the individual electrode patterns. In this way, the gates are formed respectively in the first transistor-forming region 102a, the second transistor-forming region 102b, and the third transistor-forming region 102c. Next, using the individual gates as a mask, an impurity is introduced by ion implantation into the first transistor-forming region 102a, the second transistor-forming region 102b, and the third transistor-forming region 102c. The source/drain regions 126 are thus formed in the individual regions. By these processes, the first transistor 130, the second transistor 132, and the third transistor 134 are formed.

Next, another embodiment of procedures of manufacturing the semiconductor device 100 will be detailed, referring to FIGS. 9A to 11B.

Figure 9A:
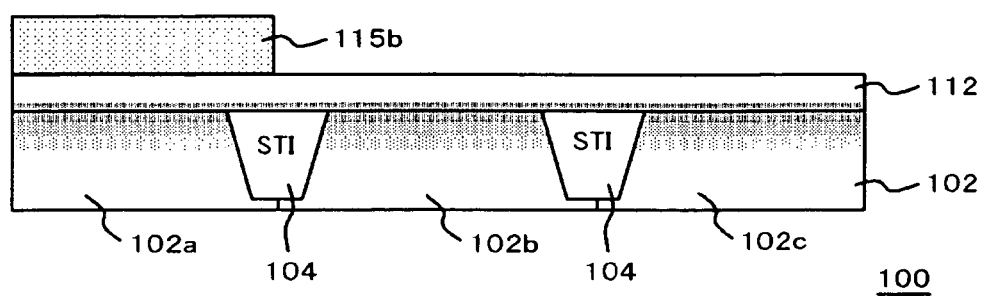
FIGS. 9A to 11B are sectional views illustrating exemplary procedures of manufacturing a semiconductor device in another embodiment of the present invention.
Figure 9B:
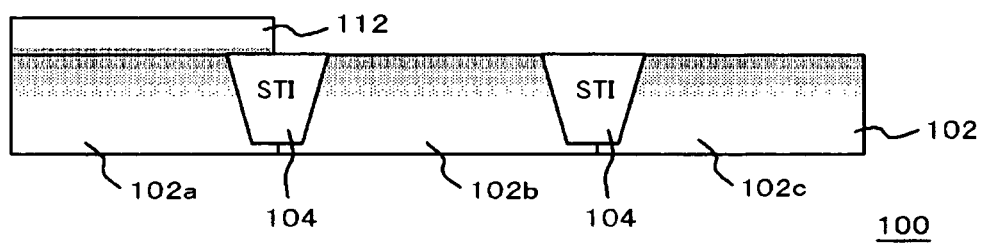

Also in this embodiment, the first thermal oxide film 112 is formed over the silicon substrate 102, according to procedures similar to those explained referring to FIGS. 3A to FIG. 5B. Next, a resist film 115b protecting only the first transistor-forming region 102a is formed over the first thermal oxide film 112 (FIG. 9A). Next, using the resist film 115b as a mask, the first thermal oxide film 112 formed in the second transistor-forming region 102b and the third transistor-forming region 102c is selectively removed (FIG. 9B).

Figure 10A:
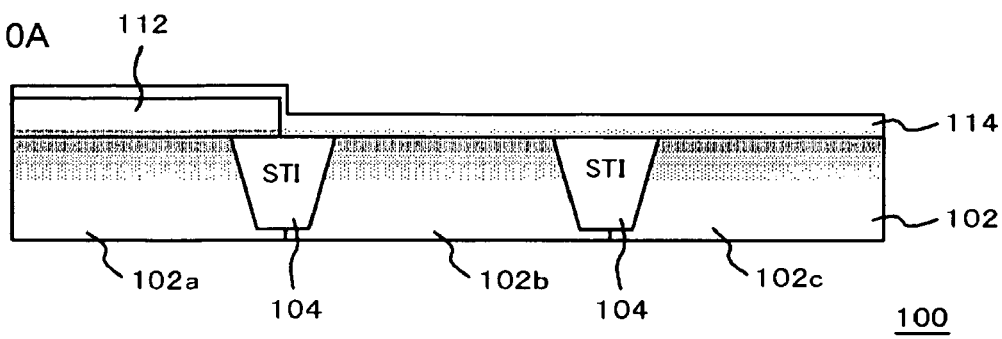
Figure 10B:
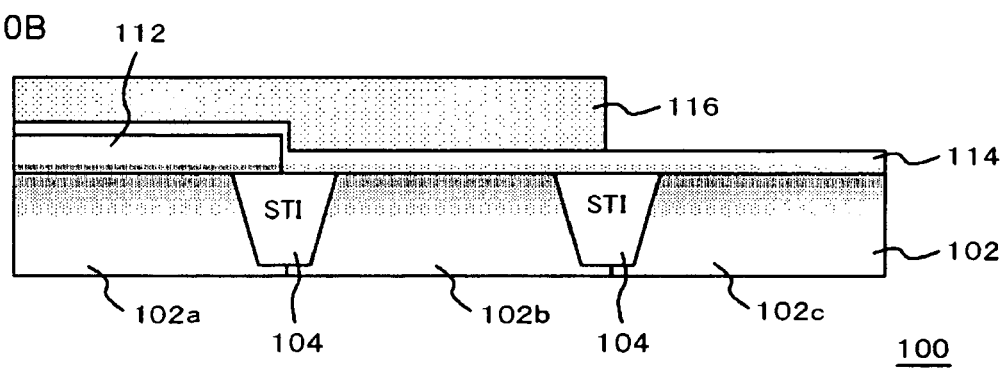
Figure 11A:
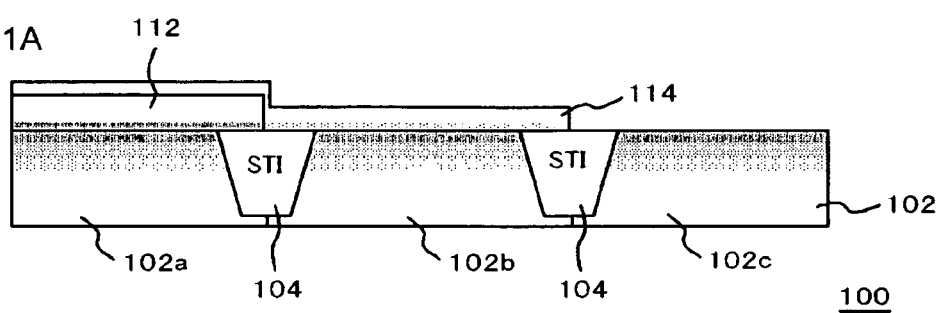
Figure 11B:
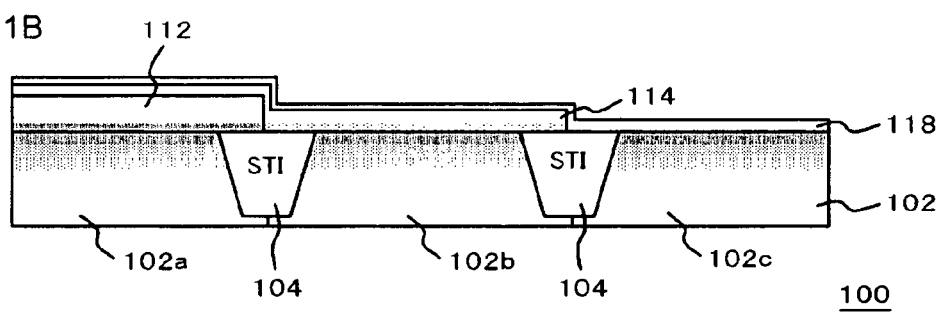

Thereafter, the second thermal oxide film 114 is formed over the entire surface of the silicon substrate 102 (FIG. 10A). Next, the resist film 116 protecting the region other than the third transistor-forming region 102c is formed over the second thermal oxide film 114 (FIG. 10B). Next, using the resist film 116 as a mask, the second thermal oxide film 114 formed in the third transistor-forming region 102c is selectively removed (FIG. 11A). Thereafter, the third thermal oxide film 118 is formed over the entire surface of the silicon substrate 102 by thermal oxidation (FIG. 11B). Thereafter, according to the procedures similar to those described in the above, the first transistor 130, the second transistor 132, and the third transistor 134 are formed. In this embodiment, the first gate oxide film 120a, the second gate oxide film 120b and the third gate oxide film 120c have the fluorine concentration (average concentration in the film) in decreasing order, where the fluorine concentration (average concentration in the film) of the first gate oxide film 120a is the highest. In this embodiment, more thicker thermal oxide film is formed more earlier, and more thicker thermal oxide film is removed in the region where the transistor having more thinner gate oxide film is formed. According to the procedures, the resultant configuration is such that the transistor having a thicker gate oxide film has a higher fluorine concentration in the gate oxide film.

Figure 12:
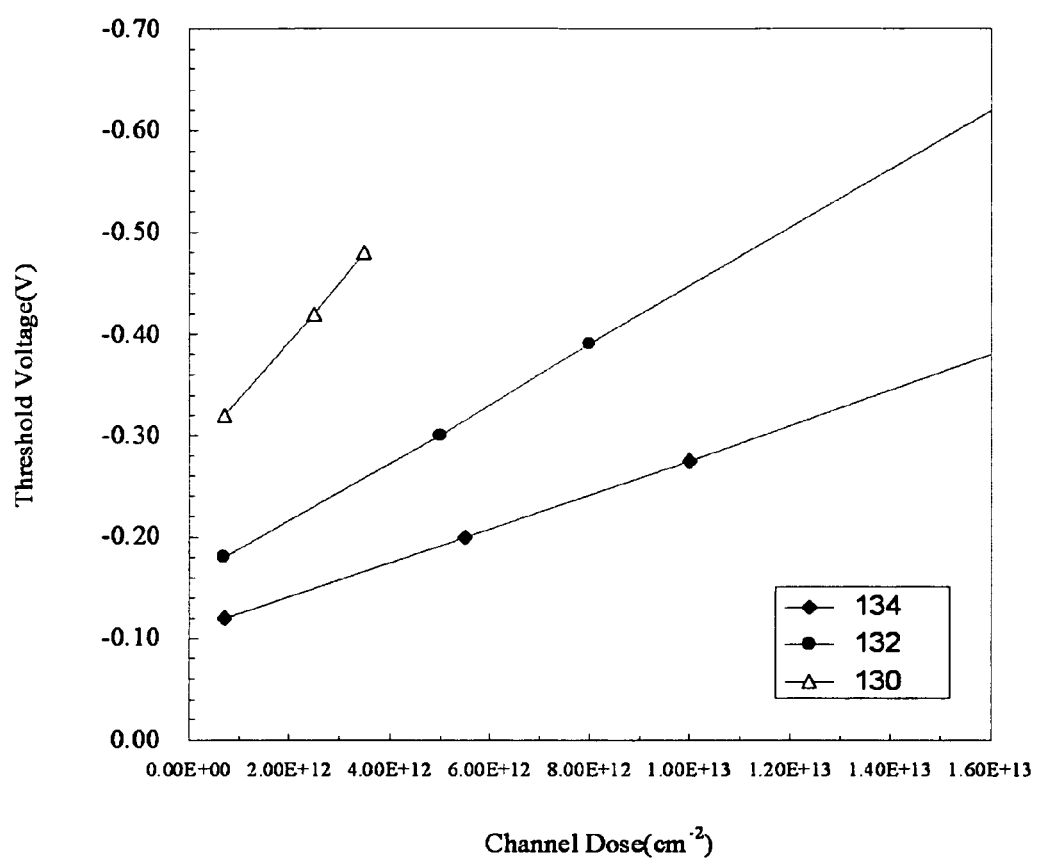
FIG. 12 is a drawing illustrating relations between threshold voltage value and phosphorus dose of the individual transistors.

FIG. 12 is a drawing illustrating relations between threshold voltage value and phosphorus dose of the individual transistors, in the semiconductor device 100 manufactured as described in the above referring to FIGS. 3A to 8B.

The abscissa represents the phosphorus dose in the individual transistors, and the ordinate represents threshold voltage value of the individual transistors. The phosphorus dose herein means the dose of phosphorus 108 in the process explained referring to FIG. 4A. As is obvious from FIG. 12, in each of the first transistor 130, the second transistor 132 and the third transistor 134, larger phosphorus dose gives higher threshold voltage (absolute value), and thicker gate insulating film gives larger degree of change in the threshold voltage relative to the phosphorus dose.

Figure 13:
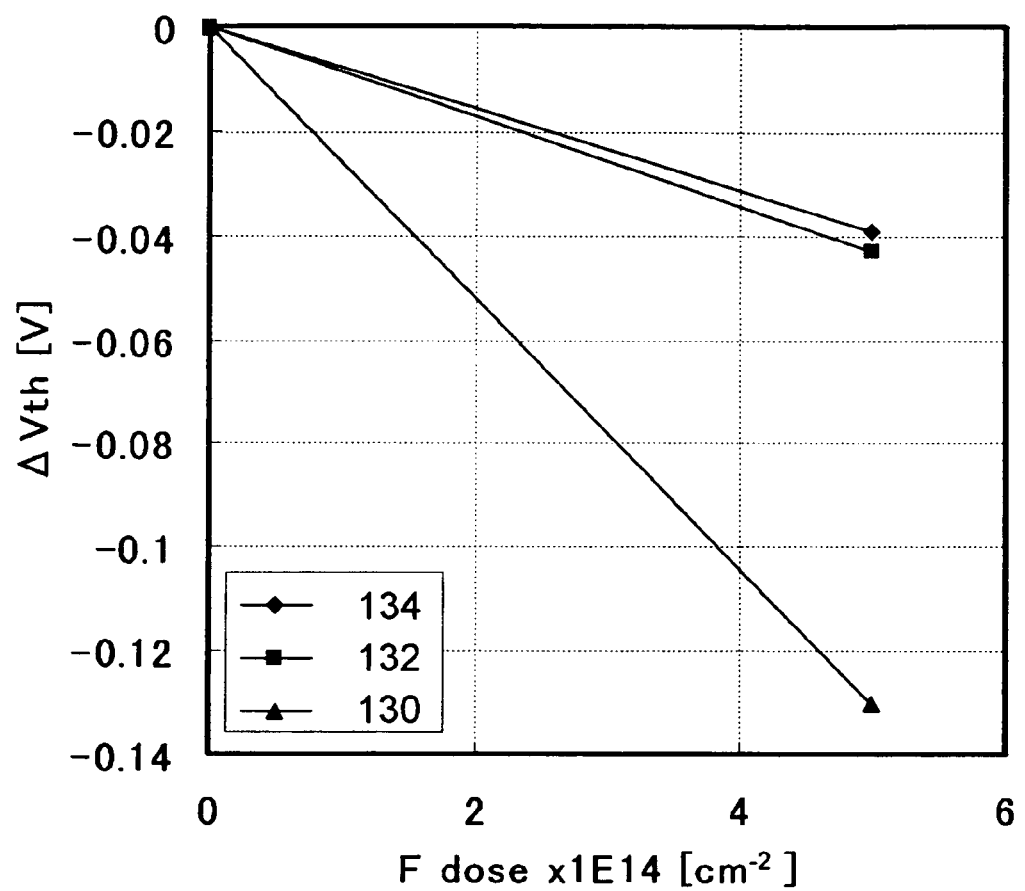
FIG. 13 is a drawing illustrating relations between threshold voltage value and fluorine dose of the individual transistors.

FIG. 13 is a drawing illustrating relations between threshold voltage value and fluorine dose of the individual transistors, in the semiconductor device 100 manufactured as described in the above.

The abscissa represents the fluorine dose in the individual transistors, and the ordinate represents the amount of change in the threshold voltage (absolute value) assuming the threshold voltage at a fluorine dose of zero as the reference (zero). The fluorine dose herein means the does of fluorine 110 in the process explained referring to FIG. 4B. As is obvious from FIG. 13, in each of the first transistor 130, the second transistor 132 and the third transistor 134, larger fluorine dose gives lower threshold voltage (absolute value). In the first transistor 130 having the thick gate insulating film, the degree of change in the threshold voltage relative to the fluorine dose is dramatically larger, as compared with those shown by the second transistor 132 and the third transistor 134.

As has been described in the above, in this embodiment, the thick first thermal oxide film 112 of the first transistor 130 is formed over the entire surface of the silicon substrate 102 in the earliest stage, and the first thermal oxide film 112 is then removed in other regions (the second transistor-forming region 102b and the third transistor-forming region 102c). Thereafter, the second thermal oxide film 114 and the third thermal oxide film 118 are newly formed in each of other regions. As a consequence, the resultant configuration is such that the first thermal oxide film 112 incorporates a higher concentration of fluorine as compared with the second thermal oxide film 114 and the third thermal oxide film 118. By virtue of this configuration, the fluorine concentration in the thick first gate oxide film 120a of the first transistor 130 may be made higher than the fluorine concentration in the gate oxide films of other transistors, without adopting the procedures of implanting fluorine a plurality of times.

The threshold voltage of the transistors may independently be adjustable, by acquiring the relations between the impurity ion dose and the threshold voltage value, and the relations between the fluorine dose and the threshold voltage value, as illustrated in FIG. 12 and FIG. 13, and by determining the impurity ion dose and fluorine dose based on these relations, depending on the threshold voltage value in the semiconductor device desired to be manufactured.

For example, as is obvious from FIG. 12, increase in the impurity ion dose results in elevation of the threshold voltage of each of the first transistor 130, the second transistor 132, and the third transistor 134. On the other hand, as is obvious from FIG. 13, increase in the fluorine dose results in dramatic decrease in the threshold voltage only in the first transistor 130. Accordingly, by appropriately adjusting the impurity ion does and fluorine dose, the threshold voltage of only of the first transistor 130 may selectively be lowered, while leaving the threshold voltage values of the second transistor 132 and the third transistor 134 unchanged.

The description in the above dealt with an exemplary case of p-type transistors. In this case, a larger fluorine does results in a lower threshold voltage (absolute value). Also with respect to an n-type transistors, the threshold voltage of only a desired transistor may selectively be controlled, by appropriately adjusting the fluorine dose, while leaving the threshold voltage values of other transistors unchanged. Note that the threshold voltage (absolute value) elevates as the fluorine dose increases.

The embodiments of the present invention have been described referring to the attached drawings only for the purpose of exemplification of the present invention, while allowing adoption of any configurations other than those described in the above.

Although embodiments of using fluorine have been described in the above, similar effects may be obtained also by using any other element such as nitrogen, capable of migrating, after being implanted into the semiconductor substrate, into the oxide film in the process of forming thereof by oxidizing the semiconductor substrate, and capable of exerting effect on the threshold value of the transistors (see S. Tsujikawa, "A Simple Approach to Optimizing Ultra-thin SiON Gate Dielectrics Independently for n- and p-MOSFETs", IEDM Technical Digest, December 2005, p. 824).

It is apparent that the present invention is not limited to the above embodiments, that may be modified and changed without departing from the scope and spirit of the invention.

What is claimed is:

1. A method of manufacturing a semiconductor device, comprising:
   simultaneously implanting an equal amount of an element selected from the group consisting of fluorine and nitrogen into a first transistor-forming region and a second transistor-forming region of a semiconductor substrate;
   oxidizing said semiconductor substrate to thereby form a first oxide film over said first transistor-forming region and said second transistor-forming region;
   selectively removing said first oxide film formed over said second transistor-forming region;
   oxidizing said semiconductor substrate to thereby form a second oxide film at least over said second transistor-forming region, a thickness of said second oxide film being less than a thickness of said first oxide film;
   forming a first transistor including said first oxide film as a gate insulating film in said first transistor-forming region, and forming a second transistor including said second oxide film as a gate insulating film in said second transistor-forming region;
   acquiring relations between a dose of said element and threshold voltage values of said first transistor and said second transistor said semiconductor device comprising a plurality of semiconductor devices said plurality of semiconductor devices being manufactured while varying said dose of said element in said implanting said element; and
   determining said dose of said element based on said relations and depending on target threshold voltage values expected for said semiconductor device to be manufactured.

2. The method of manufacturing a semiconductor device as claimed in claim 1, wherein said first oxide film and said second gate oxide film are formed such that a concentration of said element in said first oxide film is greater than a concentration of said element in said second oxide film.

3. The method of manufacturing a semiconductor device as claimed in claim 1, wherein said element comprises fluorine.

4. The method of manufacturing a semiconductor device as claimed in claim 1, wherein said implanting the element further comprises implanting said element at said dose determined in said determining said dose.

5. The method of manufacturing a semiconductor device as claimed in claim 1, wherein said first and second oxide films are formed over an entire surface of the semiconductor substrate.

6. The method of manufacturing a semiconductor device as claimed in claim 1, further comprising:
   before forming said first oxide film, forming channels in said first transistor-forming region and said second transistor-forming region by introducing an impurity by ion implantation commonly into said first transistor-forming region and said second transistor-forming region.

7. The method of manufacturing a semiconductor device as claimed in claim 6, wherein an equal amount of said impurity is implanted simultaneously over an entire surface of the semiconductor substrate.

8. The method of manufacturing a semiconductor device as claimed in claim 6, further comprising:
   acquiring second relations between a dose of said impurity and threshold voltage values of said first transistor and said second transistor, said plurality of semiconductor devices being manufactured while varying said dose of said impurity in said forming the channels; and
   determining said doses of said element and said impurity based respectively on said first relations and said second relations and depending on said target threshold voltage values expected for said semiconductor device to be manufactured.

9. The method of manufacturing a semiconductor device as claimed in claim 8, wherein said implanting said element further comprises implanting said element at said dose determined in said determining said dose of said element, and
   wherein said forming said channels further comprises implanting said impurity at said dose determined in said determining said dose of said impurity.

10. A semiconductor device, comprising:
    a semiconductor substrate having a first transistor-forming region and a second transistor-forming region that respectively comprise an element selected from the group consisting of fluorine and nitrogen;
    a first transistor formed in said first transistor-forming region of said semiconductor substrate and having a first gate oxide film that comprises said element; and
    a second transistor formed in said second transistor-forming region of said semiconductor substrate and having a second gate oxide film that comprises said element, said second gate oxide film having a thickness that is less than a thickness of said first gate oxide film, wherein a concentration of said element in said first gate oxide film is greater than a concentration of said element in said second gate oxide film, wherein the concentration of said element is uniform in an in-plane direction in each of said first gate oxide film and said second gate oxide film, wherein a difference in the concentration of said element in said first gate oxide film and the concentration of said element in said second gate oxide film, as is observed at a same level of height, is greater than a difference in a concentration of said element in said first transistor-forming region of said semiconductor substrate and a concentration of said element in said second transistor-forming region of said semiconductor substrate, as is observed at a same level of depth, wherein relations between a dose of said element and threshold voltage values of said first transistor and said second transistor are predetermined, said semiconductor device comprising a plurality of semiconductor devices, said plurality of semiconductor devices being manufactured while varying said dose of said element in implanting said element; and wherein said dose of said element is determined based on said relations and depending on target threshold voltage values expected for said semiconductor device.

11. The semiconductor device as claimed in claim 10, wherein a conductivity type of said first transistor is equivalent to a conductivity type of said second transistor.

12. The semiconductor device as claimed in claim 10, wherein said element comprises fluorine.

13. The method of manufacturing a semiconductor device as claimed in claim 1, wherein a thickness of said first oxide film formed over said first transistor-forming region is equal to a thickness of said first oxide film formed over said second transistor-forming region.

14. The method of manufacturing a semiconductor device as claimed in claim 1, further comprising:

before said implanting said element, forming an isolation region in said semiconductor substrate between said first transistor-forming region and said second transistor-forming region, wherein an edge of said isolation region is coplanar to an edge of said semiconductor substrate.

15. The method of manufacturing a semiconductor device as claimed in claim 1, wherein a concentration of said element in said second oxide film is less than a concentration of said element in said first oxide film.

16. The method of manufacturing a semiconductor device as claimed in claim 1, wherein a conductivity type of said first transistor is equivalent to a conductivity type of said second transistor.

* * * * *